(12) United States Patent
Kodama

(10) Patent No.: US 6,909,664 B1
(45) Date of Patent: Jun. 21, 2005

(54) SEMICONDUCTOR MEMORY DEVICE WITH SIMPLIFIED CONTROL OF COLUMN SWITCHES

(75) Inventor: Tsuyoshi Kodama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/995,397

(22) Filed: Nov. 24, 2004

(30) Foreign Application Priority Data

May 20, 2004 (JP) ........................................ 2004-150620

(51) Int. Cl.$^7$ ............................................... G11C 8/10
(52) U.S. Cl. ............................ 365/230.06; 365/230.03; 365/233; 365/190; 365/193
(58) Field of Search ............................ 365/230.06, 156, 365/154, 190, 230.03, 233, 193, 191

(56) References Cited

U.S. PATENT DOCUMENTS

| | | | | |
|---|---|---|---|---|
| 5,757,696 A | * | 5/1998 | Matsuo et al. | 365/185.07 |
| 6,674,685 B2 | * | 1/2004 | Fujino | 365/230.06 |
| 2004/0208045 A1 | * | 10/2004 | Shiratake | 365/145 |

FOREIGN PATENT DOCUMENTS

JP   2000-30447   1/2000   ......... G11C/11/407

* cited by examiner

*Primary Examiner*—Andrew Q. Tran
(74) *Attorney, Agent, or Firm*—Arent Fox, PLLC.

(57) ABSTRACT

A semiconductor memory device includes a bit line to be coupled to a memory cell, a data-bus line, a gate situated between the bit line and the data-bus line to control a coupling between the bit line and the data-bus line, and a signal generating circuit configured to generate at least one signal for controlling opening/closing of the gate in response to data that is to be stored in the memory cell.

8 Claims, 8 Drawing Sheets

SEMICONDUCTOR MEMORY DEVICE WITH SIMPLIFIED CONTROL OF COLUMN SWITCHES

CROSS-REFERENCE TO RELATED APPLICATIONS

The present application is based upon and claims the benefit of priority from the prior Japanese Patent Application No. 2004-150620 filed on May 20, 2004, with the Japanese Patent Office, the entire contents of which are incorporated herein by reference.

BACKGROUND OF THE INVENTION

1. Field of the Invention

The present invention generally relates to semiconductor memory devices, and particularly relates to a semiconductor memory device in which bit lines are coupled to data bus lines in response to column selection and write/read selection.

2. Description of the Related Art

In a semiconductor memory device carrying out a data-read operation, the data of a plurality of memory cells corresponding to a selected word address are read to a plurality of pairs of bit lines, and the data of one of the bit-line pairs corresponding to a selected column address is output to an exterior of the device via the read data bus. When data is provided from the exterior, the data is supplied to one of the bit-line pairs corresponding to a selected column address via the write data bus, and is written in the memory cell corresponding to a selected word address among the plurality of memory cells connected to this bit line pair. Coupling between the bit lines and the read data bus and coupling between the bit lines and the write data bus are controlled by column switches.

FIG. 1 is an illustrative drawing showing an example of the configuration of a related-art semiconductor memory device. A semiconductor memory device 10 of FIG. 1 includes a control circuit 11, a word driver 12, a word driver 13, a block control circuit 14, memory cell arrays 15-1 through 15-n, memory cell arrays 16-1 through 16-n, sense amplifiers (S/A) 17-1 through 17-n, column switches 18-1 through 18-n, column switches 19-1 through 19-n, and write-data generating units 20-1 through 20-n. The control circuit 11 receives a clock signal CK, a write-enable signal WE, and an address data signal from the exterior, and generates control signals for controlling each part of the device according to these received signals. A column signal and write-control signal supplied from the control circuit 11 control the column switches 18-1 through 18-n and 19-1 through 19-n.

FIG. 2 is a circuit diagram showing the configuration of the column switches 19-1 through 19-n and surrounding circuit portions. The column switches 18-1 through 18-n have the same configuration as shown in FIG. 2.

Memory cells 21-1 through 21-n each include PMOS transistors 31 and 32 and NMOS transistors 33 through 36. The PMOS transistors 31 and 32 and the NMOS transistors 33 and 34 constitute a latch for storing data. When a word line WL is set to HIGH, the NMOS transistors 35 and 36 become conductive, thereby coupling the memory cell to bit lines BL and /BL. Precharge units 22-1 through 22-n each include PMOS transistor 41 through 43, and an inverter 44. When a precharge signal is set to HIGH, the bit lines BL and /BL are precharged and equalized.

A column switch 19-x ($1<=x<=n$) includes NMOS transistors 51 and 52, a NAND gate 53, a NOR gate 54, an inverter 55, and PMOS transistors 56 and 57. The NAND gate 53 receives two column signals corresponding to its local column address among column signals (column selection signals) responsive to a column address entered from the exterior of the semiconductor memory device. When these two column signals are set to HIGH, the NAND gate 53 outputs a LOW signal. In response, the PMOS transistors 56 and 57 become conductive, thereby coupling the bit lines BL and /BL to a read-data bus RDB and RDBX. If the write-control signal is HIGH at this time, the output of the inverter 55 is LOW, so that the output of the NOR gate 54 becomes HIGH. In response, the NMOS transistors 51 and 52 become conductive, thereby coupling the bit lines BL and /BL to a write-data bus WDB and WDBX. In this manner, when a correspondence column signal is HIGH, the bit-line pair is chosen and coupled to the read-data bus. If the write-control signal is HIGH, the bit-line pair is also coupled to the write-data bus. If the write-control signal is LOW, the bit-line pair is not coupled to the write-data bus.

As described above, the operation of the column switch is controlled based on the column signal and the write-control signal. In order to perform a write operation properly, the three signals, i.e., the write data, the column signal, and the write-control signal, are supplied at optimum timing.

FIG. 3 is a timing chart showing an example of proper timing relationships between the write data, the column signal, and the write-control signal. As shown in FIG. 3, it is preferable that write data WDB and WDBX are supplied before the column signal and write-control signal are set to HIGH to couple the write-data bus to the bit lines. Moreover, it is preferable that the selection of read operation or write operation in response to the write-control signal is made prior to column selection by the column signal. In order to provide a predetermined time period required for the write operation, these three signals need to be determined before predetermined timing. If these timing relationships are undermined, causes of malfunction may be created, such as noises occurring in other circuits, the lack of time necessary for the write operation, the lack of time for driving the bit lines, etc.

In the semiconductor memory device of FIG. 1, signal lines to supply the write-control signal extend in both the X direction and the Y direction from the control circuit 11. The signal line in the X direction serves to control the write-data generating units 20-1 through 20-n, and the signal line in the Y direction serve to control the column switches 18-1 through 18-n and 19-1 through 19-n. In response to the write-control signal propagating in the X direction from the control circuit 11, the write-data generating units 20-1 through 20-n generate write data, which then propagate in the Y direction. The write-control signal propagating in the Y direction from the control circuit 11 is buffered, and then changes its direction to propagate in the X direction. Moreover, the column signal transmitted from the control circuit 11 propagates in the Y direction first, and then changes its direction to propagate in the X direction. With the control circuit 11 serving as the signal source, the write-data signal, the write-control signal, and the column signal all propagate substantially the same distance on signal lines before they reach the position of the destination column switch.

In the related art, Patent Document 1 discloses a technology for increasing the speed of column-system operations.
[Patent Document 1] Japanese Patent Application Publication No. 2000-30447

The write-data signal, the write-control signal, and the column signal propagate through different signal lines. The load of the transistors connected to these signal lines and the load of the actually laid-out signal lines may differ from line to line. As shown in FIG. 1, the column switches are positioned at respective, different locations in the layout of the semiconductor memory device. Depending on its position, a signal reaching a given column switch may have timing that is deviated from the desired timing. It is not easy to ensure desired timing at all the locations where the column switches are situated. The adjustment of buffering, modification of the layout, insertion of a timing adjusting circuit, or the like is thus necessary to ensure proper timing margins.

Further, in addition to the write-control signal and the column signal, the control circuit 11 transmits various signals such as a row selection signal, an S/A signal, and a block selection signal in the Y direction. The control circuit 11 has buffers provided therein for transmitting these signals. The longer the propagation distance in the Y direction, the larger the drive capacity and size of the buffers need to be. Since a large number of buffers are crowded, the efficiency of layout drops.

Accordingly, there is a need for simplification of the mechanism to supply signals necessary for the control of column switches.

SUMMARY OF THE INVENTION

It is a general object of the present invention to provide a semiconductor memory device that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a semiconductor memory circuit particularly pointed out in the specification in such full, clear, concise, and exact terms as to enable a person having ordinary skill in the art to practice the invention.

To achieve these and other advantages in accordance with the purpose of the invention, the invention provides a semiconductor memory device, which includes a bit line to be coupled to a memory cell, a data-bus line, a gate situated between the bit line and the data-bus line to control a coupling between the bit line and the data-bus line, and a signal generating circuit configured to generate at least one signal for controlling opening/closing of the gate in response to data that is to be stored in the memory cell.

According to at least one embodiment of the invention, the operation of the gates that constitute column switches is controlled based on a column signal supplied from a control circuit and the signal supplied from the signal generating circuit. Since the signal generating circuit generates the signal in response to the write data, the timing at which such signal is supplied is fixed to the timing at which the write data is supplied. In order to perform a write operation properly, therefore, it suffices to provide the two signals, i.e., the write data and the column signal, at optimum timing. Compared with the related-art configuration in which three signals have to be taken care of, this embodiment of the invention can readily perform a more reliable write operation and read operation, thereby reducing the burden on the timing design. Further, easier implementation of reliable operation timing makes it possible to improve the reliability of the semiconductor memory device, and also makes it possible to cope with the enhancement of operation speed easily.

Moreover, there is a need to provide a large number of buffers for transmitting signals in the control circuit in order to transmit various signals such as a row selection signal, an S/A signal, and a block selection signal from the control circuit in the Y direction. In at least one embodiment of the present invention, there is no need to transmit the write-control signal from the control circuit in the Y direction, so that the number of buffers and signal lines can be reduced compared with the related-art configuration, thereby improving layout efficiency.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

Figure 4:
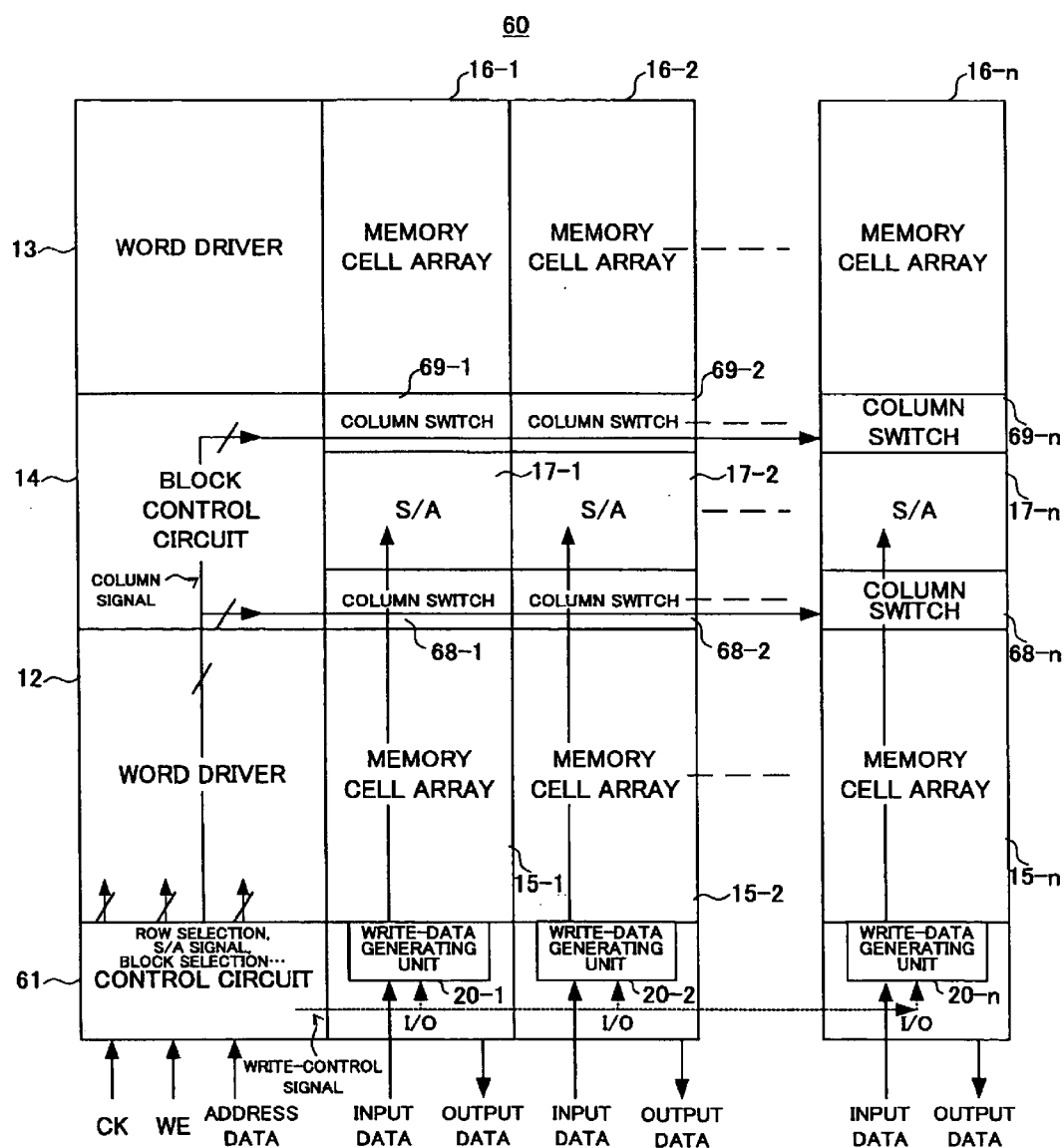
FIG. 4 is a block diagram showing an example of the configuration of a semiconductor memory device according to the present invention.

FIG. 4 is a block diagram showing an example of the configuration of a semiconductor memory device according to the present invention. A semiconductor memory device 60 of FIG. 4 includes a control circuit 61, a word driver 12, a word driver 13, a block control circuit 14, memory cell arrays 15-1 through 15-n, memory cell arrays 16-1 through 16-n, sense amplifiers (S/A) 17-1 through 17-n, column switches 68-1 through 68-n, column switches 69-1 through 69-n, and write-data generating units 20-1 through 20-n. The control circuit 61 receives a clock signal CK, a write-enable signal WE, and an address data signal from the exterior, and generates control signals for controlling each part of the device according to these received signals. The control circuit 61 supplies a column signal, which controls the column selection operation of the column switches 68-1 through 68-n and 69-1 through 69-n.

In the present invention, the selection of either read operation or write operation by the column switches 68-1 through 68-n and 69-1 through 69-n is not controlled based on the write-control signal supplied from the control circuit 61, but is controlled based on the write data supplied from the write-data generating units 20-1 through 20-n. The write-data generating units 20-1 through 20-n receive the write data from the exterior of the semiconductor memory device. In response to the write-control signal supplied from the control circuit 61, the write-data generating units 20-1 through 20-n supply the write data to the column switches 68-1 through 68-n and the column switches 69-1 through 69-n.

Figure 2:
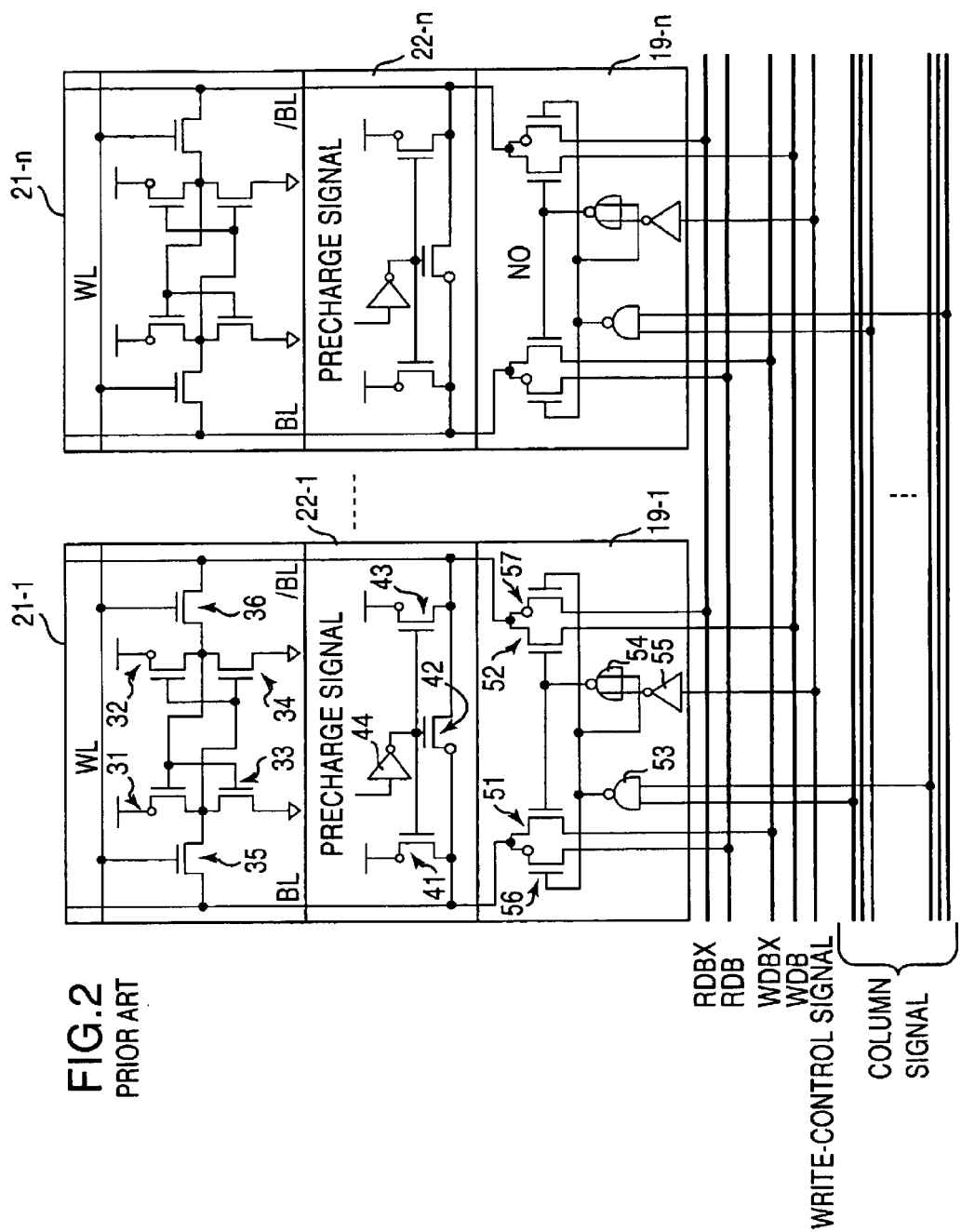
FIG. 2 is a circuit diagram showing the configuration of the column switches 19-1 through 19-n and surrounding circuit portions.
Figure 3:
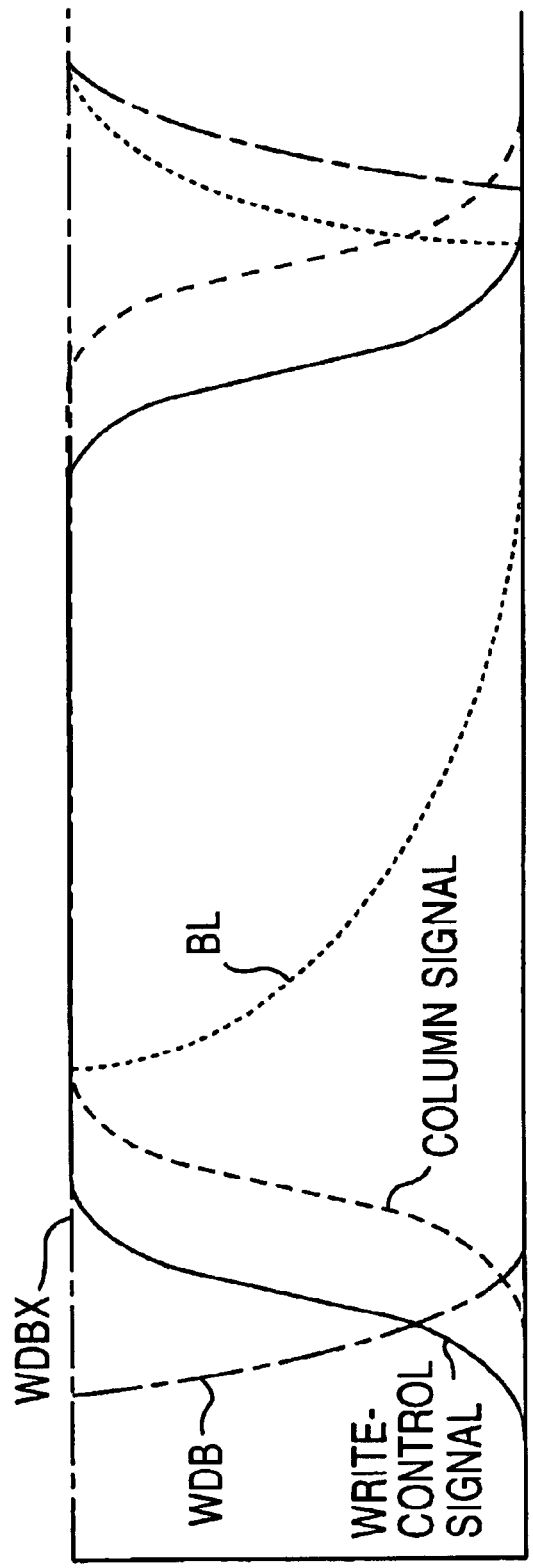
FIG. 3 is a timing chart showing an example of proper timing relationships between the write data, the column signal, and the write-control signal.
Figure 5:
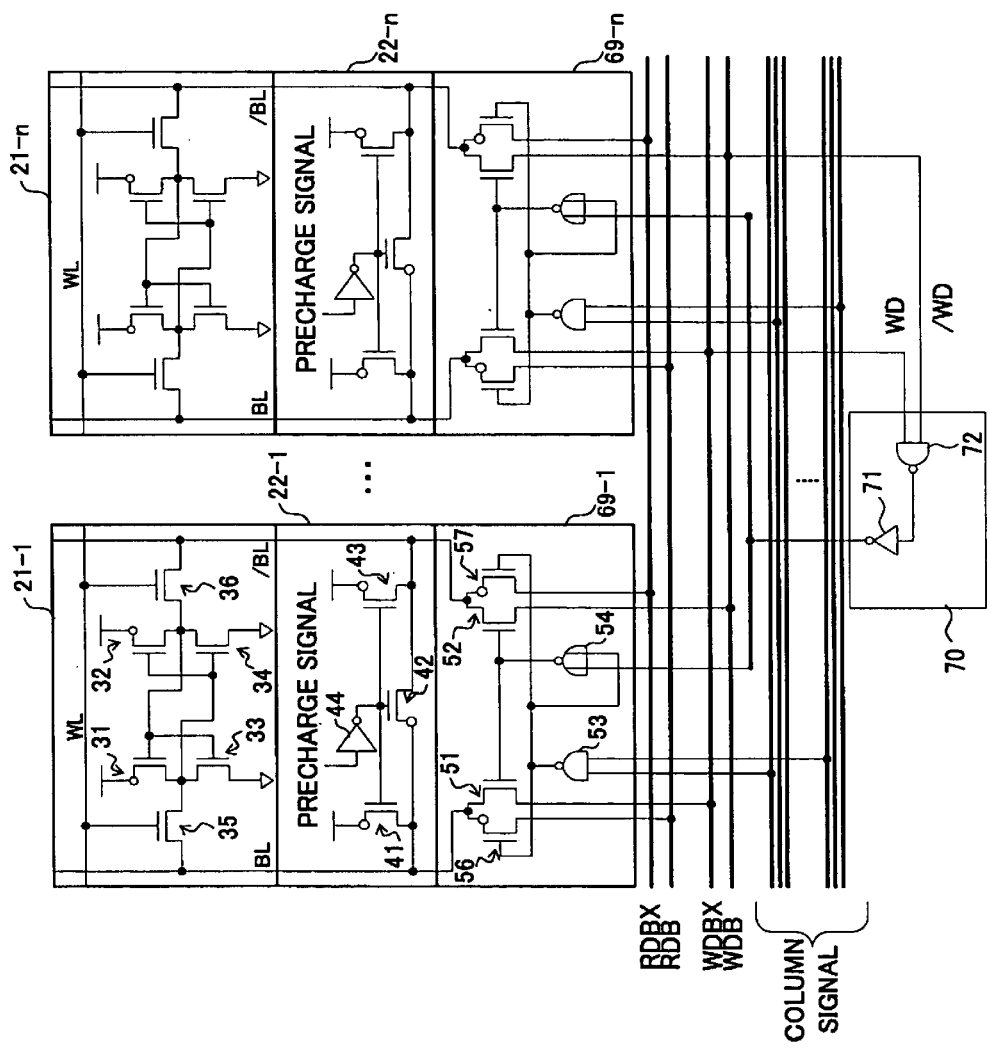
FIG. 5 is a circuit diagram showing the configuration of the column switches 69-1 through 69-n and surrounding portions in detail.

FIG. 5 is a circuit diagram showing the configuration of the column switches 69-1 through 69-n and surrounding portions in detail. The column switches 68-1 through 68-n have the same configuration as that shown in FIG. 5. In FIG. 5, the same elements as those of FIG. 2 are referred to by the same numerals, and a description thereof will be omitted.

A column switch 69-x (1<=x<=n) includes the NMOS transistors 51 and 52, the NAND gate 53, the NOR gate 54, and the PMOS transistors 56 and 57. The NAND gate 53 receives two column signals corresponding to its local column address among column signals (column selection signals) responsive to a column address entered from the exterior of the semiconductor memory device. When these two column signals are set to HIGH, the NAND gate 53 outputs a LOW signal. In response, the PMOS transistors 56 and 57 become conductive, thereby coupling the bit lines BL and /BL to the read-data bus RDB and RDBX. If a write-indication signal generated by a write-indication-signal generating circuit 70 is LOW at this time, the output of the NOR gate 54 becomes HIGH. In response, the NMOS transistors 51 and 52 become conductive, thereby coupling the bit lines BL and /BL to the write-data bus WDB and WDBX. In this manner, when a correspondence column signal is HIGH, the bit-line pair is chosen and coupled to the read-data bus. If the write-indication signal is LOW, the bit-line pair is also coupled to the write-data bus. If the write-indication signal is HIGH, the bit-line pair is not coupled to the write-data bus.

The write-indication-signal generating circuit 70 generates the write-indication signal in response to the write data WD and /WD. The write data WD and /WD, which are complementary signals, are both HIGH when there is no data to be written. If there is data to be written, one of these signals becomes HIGH and the other becomes LOW according to the 0/1 status of the data. Accordingly, the write-indication-signal generating circuit 70, which is an AND logic implemented by an inverter 71 and a NAND gate 72, outputs a HIGH write-indication signal when there is no data to be written, and outputs a LOW write-indication signal when there is data to be written.

With the provision as described above, the operation of the column switches is controlled based on the column signal supplied from the control circuit 61 and the write-indication signal supplied from the write-indication-signal generating circuit 70. The write-indication-signal generating circuit 70, which generates the write-indication signal in response to the write-data signals, is located in the proximity of the column switches 69-1 through the 69-n. Because of this, the timing at which the write-indication signal is supplied to the column switches 69-1 through 69-n is fixed to the timing at which the write-data signals are supplied. Namely, a difference in supply timing between the write-indication signal and the write-data signals is constant, being a fixed timing difference that can be included into calculation with sufficient accuracy.

In order to perform a write operation properly, it suffices to provide the two signals, i.e., the write-data signal and the column signal, at optimum timing.

Figure 6:
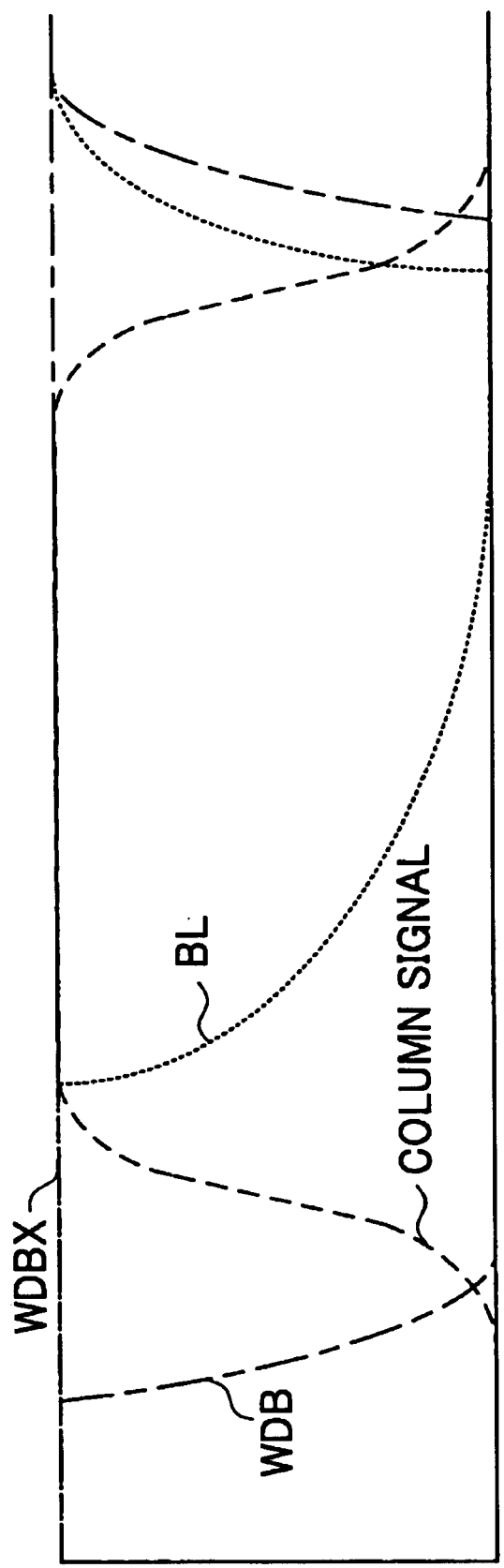
FIG. 6 is a timing chart showing an example of the proper timing relationships between the write data and the column signal.

FIG. 6 is a timing chart showing an example of the proper timing relationships between the write data and the column signal. As shown in FIG. 6, it is preferable that the write data WDB and WDBX are supplied before the column signal is set to HIGH to couple the write-data bus to the bit lines. Since the write-indication signal is supplied in response to the write data WDB and WDBX at timing immediately following the timing of the write data WDB and WDBX, there is no problem with the timing of the write-indication signal. Further, in order to ensure that a required time period is available to the write operation, all that is necessary is to ensure that the two signals, i.e., the write data and the column signal, are determined prior to a predetermined timing.

Figure 1:
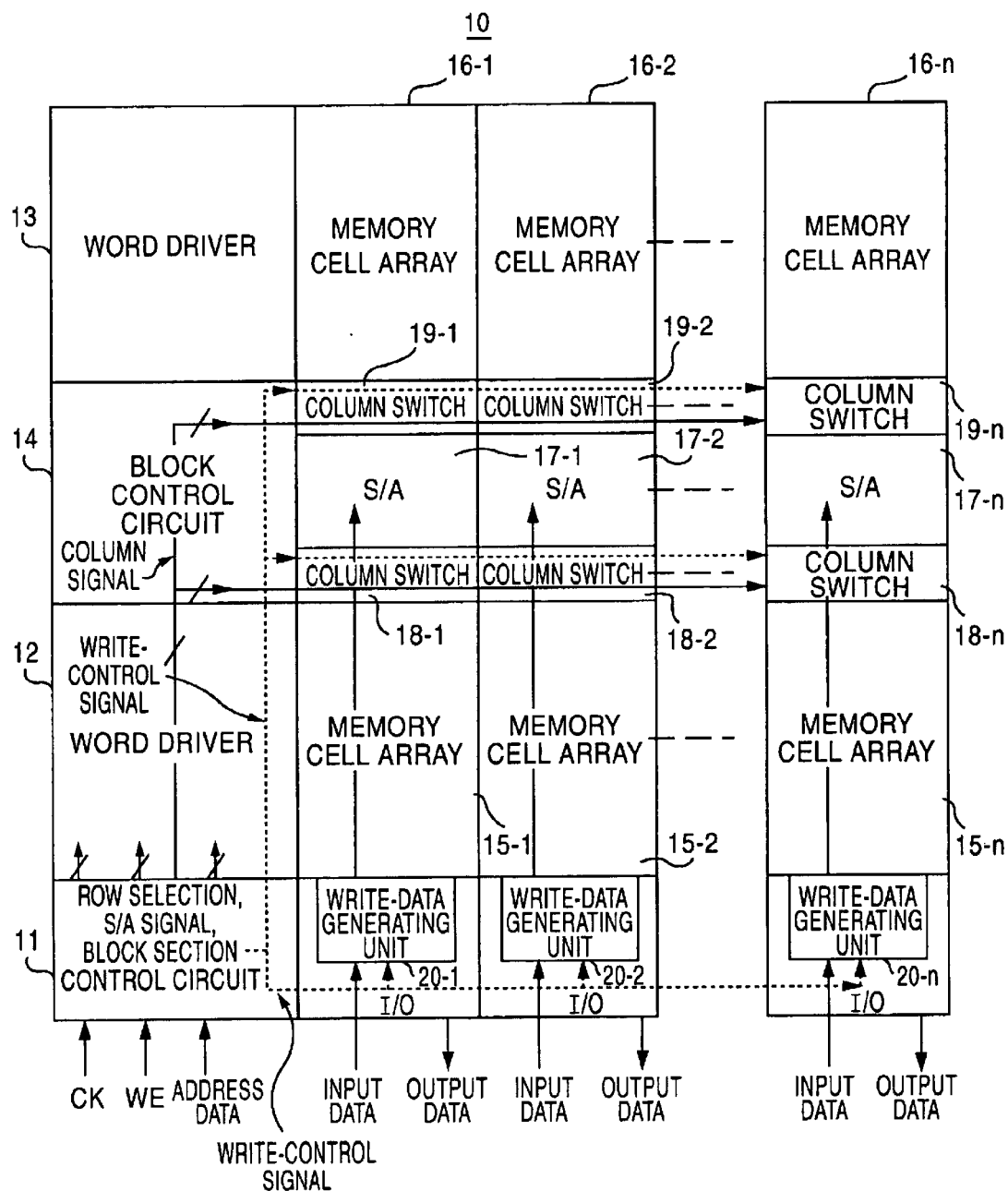
FIG. 1 is an illustrative drawing showing an example of the configuration of a related-art semiconductor memory device.

In the embodiment of the present invention described above, it suffices to take into account a timing difference only with respect to the two signals as shown in FIG. 4 and FIG. 5, in contrast with the three signals that were required in the related-art configuration shown in FIG. 1 and FIG. 2, when signals propagate a long distance inside the semiconductor memory device. Compared with the related-art configuration, therefore, this embodiment of the invention can readily perform a more reliable write operation and read operation, thereby reducing the burden on the timing design. Further, easier implementation of reliable operation timing makes it possible to improve the reliability of the semiconductor memory device, and also makes it possible to cope with the enhancement of operation speed easily.

Moreover, there is a need to provide a large number of buffers for transmitting signals in the control circuit 61 in order to transmit various signals such as a row selection signal, an S/A signal, and a block selection signal from the control circuit in the Y direction. In the embodiment described above, there is no need to transmit the write-control signal from the control circuit 61 in the Y direction, so that the number of buffers and signal lines can be reduced compared with the related-art configuration, thereby improving layout efficiency.

Figure 7:
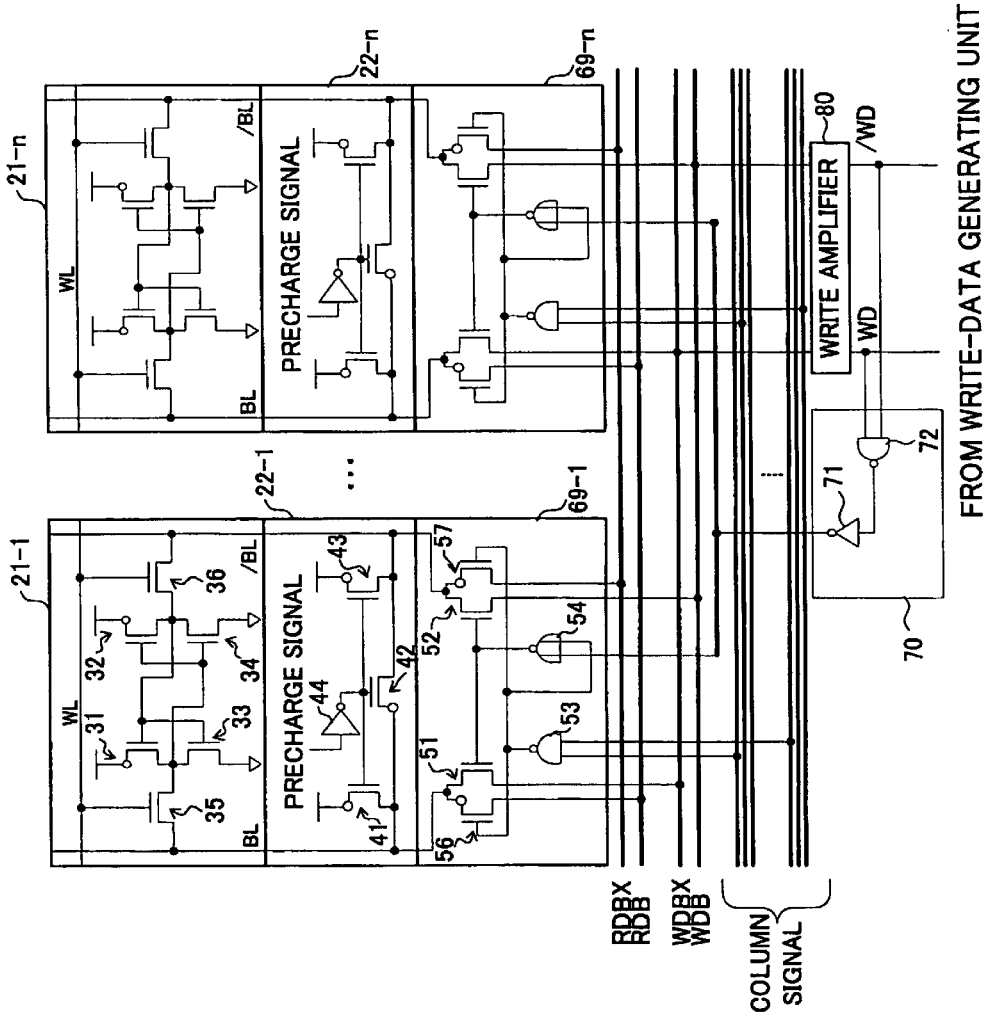
FIG. 7 is a circuit diagram showing a variation of the construction shown in FIG. 5.

FIG. 7 is a circuit diagram showing a variation of the construction shown in FIG. 5. In FIG. 7, the same elements as those of FIG. 5 are referred to by the same numerals, and a description thereof will be omitted.

In FIG. 7, the write data WD and /WD provided from the write-data generating units 20-1 through 20-n and /WD are supplied to the write-data bus WDB and WDBX through a write amplifier 80. In the configuration shown in FIG. 5, the write-data generating units 20-1 through 20-n serve to provide an amplifier function. In the configuration shown in FIG. 7, on the other hand, the write amplifier 80 amplifies the write data, and, then, the amplified write data is supplied to the column switches 69-1 through 69-n through the write-data bus WDB and WDBX. Here, the write amplifier 80 may be provided in the chip area where the sense amplifiers 17-1 through 17-n are situated in FIG. 4.

Since the write-indication-signal generating circuit 70 is connected to the input side of the write amplifier 80 as opposed to the output side thereof, the write-indication-signal generating circuit 70 does not impose unnecessary load on the write data.

Figure 8:
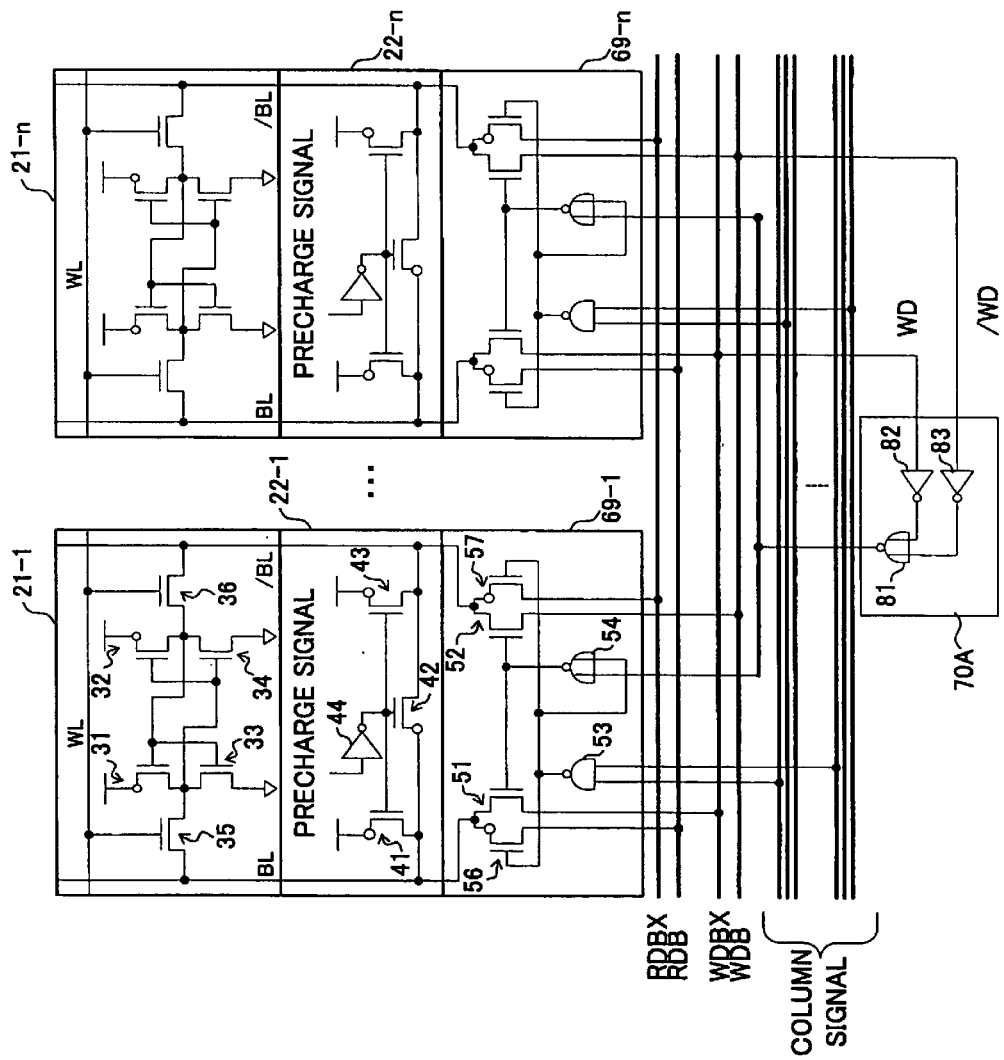
FIG. 8 is a circuit diagram showing another variation of the configuration shown in FIG. 5.

FIG. 8 is a circuit diagram showing a variation of the configuration shown in FIG. 5. In FIG. 7, the same elements as those of FIG. 5 are referred to by the same numerals, and a description thereof will be omitted.

In the configuration shown in FIG. 8, a write-indication-signal generating circuit 70A is provided in place of the write-indication-signal generating circuit 70 shown in FIG. 7. The write-indication-signal generating circuit 70A includes a NOR gate 81 and inverters 82 and 83. With this provision, the write-indication-signal generating circuit 70A achieves an AND logic by use of the NOR gate 81 and the inverters 82 and 83, which is logically the same configuration as that of the write-indication-signal generating circuit 70. The configuration of FIG. 8 can thus provide the write-indication signal to the column switches 69-1 through 69-n only when there is data to be written, as in the configuration shown in FIG. 7.

Further, the present invention is not limited to these embodiments, but various variations and modifications may be made without departing from the scope of the present invention.

These embodiments have been described with reference to an example where an SRAM (static random access memory) is used as a semiconductor memory device. The semiconductor memory devices to which the present invention is applicable are not limited to this example, and may include DRAMs (dynamic random access memories), flash memories, etc.

What is claimed is:

1. A semiconductor memory device, comprising:
 a bit line to be coupled to a memory cell;
 a data-bus line;
 a gate situated between said bit line and said data-bus line to control a coupling between said bit line and said data-bus line; and
 a signal generating circuit configured to generate at least one signal for controlling opening/closing of said gate in response to data that is to be stored in the memory cell.

2. The semiconductor memory device as claimed in claim 1, wherein said gate is a column gate that selects a column in response to a column address.

3. The semiconductor memory device as claimed in claim 2, wherein said data-bus line includes a read-data bus line and a write-data bus line, said column gate coupling said bit line to said write-data bus line in response to selection of a corresponding column and assertion of said at least one signal.

4. The semiconductor memory device as claimed in claim 3, wherein said signal generating circuit asserts said at least one signal when the data to be stored in the memory cell is in existence.

5. The semiconductor memory device as claimed in claim 4, wherein said data comprises a pair of data signals, and said signal generating circuit asserts said at least one signal in response to detection that a level of one of the data signals becomes complementary to a level of another one of the data signals.

6. The semiconductor memory device as claimed in claim 4, further comprising a write amplifier configured to amplify the data for storage in the memory cell, wherein said signal generating circuit is coupled to an input of said write amplifier to receive the data.

7. A semiconductor memory device, comprising:
 a write-data bus configured to carry a write-data signal for storage in a memory cell;
 a gate configured to open in response to the write-data signal; and
 a bit line to be coupled to said write-data bus via said gate.

8. A semiconductor memory device comprising a column gate configured such that opening/closing thereof is controlled in response to a write-data signal and a column selection signal responsive to a column address.

* * * * *